(12) United States Patent

Gejo et al.

(10) Patent No.: US 12,615,820 B2
(45) Date of Patent: Apr. 28, 2026

(54) IGBT DEVICE WITH ELECTRODE PADS OF VARIED SHAPE TO DISCRIMINATE PADS IN CHIP OPERATION AND TESTING

(71) Applicants: Kabushiki Kaisha Toshiba, Tokyo (JP); Toshiba Electronic Devices & Storage Corporation, Tokyo (JP)

(72) Inventors: Ryohei Gejo, Kawasaki Kanagawa (JP); Hideaki Kitazawa, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 415 days.

(21) Appl. No.: 18/225,590

(22) Filed: Jul. 24, 2023

(65) Prior Publication Data

US 2024/0290840 A1     Aug. 29, 2024

(30) Foreign Application Priority Data

Feb. 28, 2023     (JP) ................................. 2023-030200

(51) Int. Cl.
H01L 23/498 (2006.01)
H01L 21/66 (2006.01)
(Continued)

(52) U.S. Cl.
CPC ......... *H10D 62/127* (2025.01); *H10D 12/481* (2025.01); *H10D 62/141* (2025.01); *H10D 64/518* (2025.01); *H10D 64/519* (2025.01)

(58) Field of Classification Search
CPC .......... H10D 12/031–038; H10D 12/411–491; H10D 62/141–148; H10D 64/511; H10D 64/518; H10D 64/519
See application file for complete search history.

(56) References Cited

U.S. PATENT DOCUMENTS 6,472,693 B1    10/2002    Takahashi et al.
9,041,456 B2    5/2015    Hasegawa et al.
(Continued)

FOREIGN PATENT DOCUMENTS

JP          3586193 B2    11/2004
JP      2007-115888 A    5/2007
(Continued)

OTHER PUBLICATIONS

Office Action issued in Japanese Patent Application No. 2023-030200, dated Feb. 27, 2026 in 10 pages.

*Primary Examiner* — Wael M Fahmy
*Assistant Examiner* — Aneesa Riaz Baig
(74) *Attorney, Agent, or Firm* — Knobbe, Martens, Olson & Bear, LLP

(57)     ABSTRACT

A semiconductor device includes first and second electrodes, first to fourth semiconductor regions, first and second control electrodes, and first and second electrode pads. The first semiconductor region is located on the first electrode. The second semiconductor region is located on the first semiconductor region. The third semiconductor region is located on the second semiconductor region. The fourth semiconductor region is located on a portion of the third semiconductor region. The first control electrode faces the second, third, and fourth semiconductor regions via a first insulating film. The second control electrode faces the second and third semiconductor regions via a second insulating film. The first electrode pad is electrically connected with the first control electrode. The second electrode pad is electrically connected with the second control electrode. The second electrode pad has a different planar shape from the first electrode pad.

10 Claims, 6 Drawing Sheets

(51) Int. Cl.

| | | |
|---|---|---|
| *H01L 23/00* | (2006.01) |
| *H10D 12/00* | (2025.01) |
| *H10D 62/10* | (2025.01) |
| *H10D 62/13* | (2025.01) |
| *H10D 64/27* | (2025.01) |

(56) References Cited

U.S. PATENT DOCUMENTS

| | | | |
|---|---|---|---|
| 10,573,732 B2* | 2/2020 | Iwakaji | H10D 64/513 |
| 10,811,524 B2 | 10/2020 | Iwakaji et al. | |
| 10,978,580 B2* | 4/2021 | Shinsho | H10D 64/231 |
| 11,063,130 B2 | 7/2021 | Iwakaji et al. | |
| 11,101,375 B2 | 8/2021 | Matsudai et al. | |
| 11,222,891 B2 | 1/2022 | Matsudai et al. | |
| 11,245,393 B2 | 2/2022 | Tanaka et al. | |
| 11,282,949 B2 | 3/2022 | Iwakaji et al. | |
| 11,349,018 B2 | 5/2022 | Iwakaji et al. | |
| 2020/0411643 A1 | 12/2020 | Hoshi | |
| 2021/0126100 A1 | 4/2021 | Sakano et al. | |
| 2021/0134791 A1* | 5/2021 | Gejo | H10D 8/422 |
| 2023/0006057 A1* | 1/2023 | Gejo | H10D 64/232 |
| 2024/0055386 A1* | 2/2024 | Yoshida | H01L 24/29 |

FOREIGN PATENT DOCUMENTS

| | | | |
|---|---|---|---|
| JP | 4915297 | B2 | 4/2012 |
| JP | 5568922 | B2 | 8/2014 |
| JP | 5925364 | B2 | 5/2016 |
| JP | 6656414 | B2 | 3/2020 |
| JP | 2020-155582 | A | 9/2020 |
| JP | 2021-005664 | A | 1/2021 |
| JP | 2021-048337 | A | 3/2021 |
| JP | 2021-048338 | A | 3/2021 |
| JP | 2021-068845 | A | 4/2021 |
| JP | 2021-150542 | A | 9/2021 |
| JP | 7041653 | B2 | 3/2022 |
| JP | 7091204 | B2 | 6/2022 |
| WO | WO 99/56323 | A1 | 11/1999 |

* cited by examiner

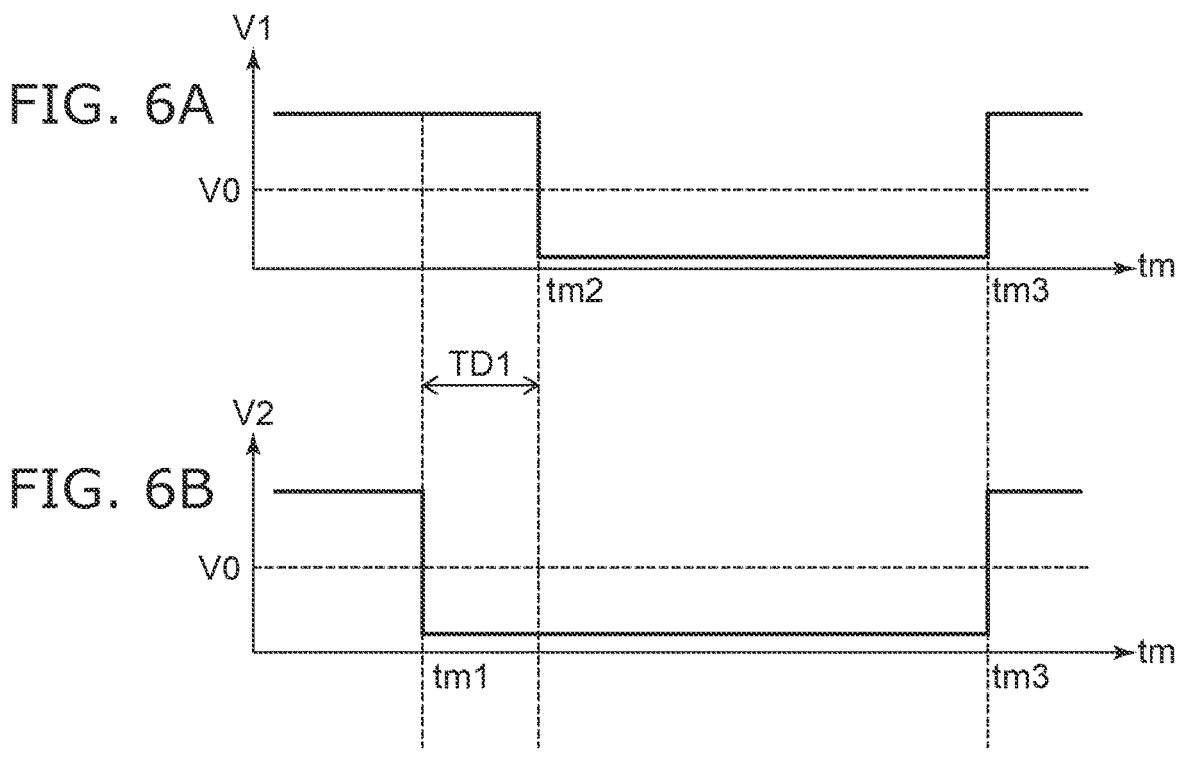
FIG. 6A
FIG. 6B
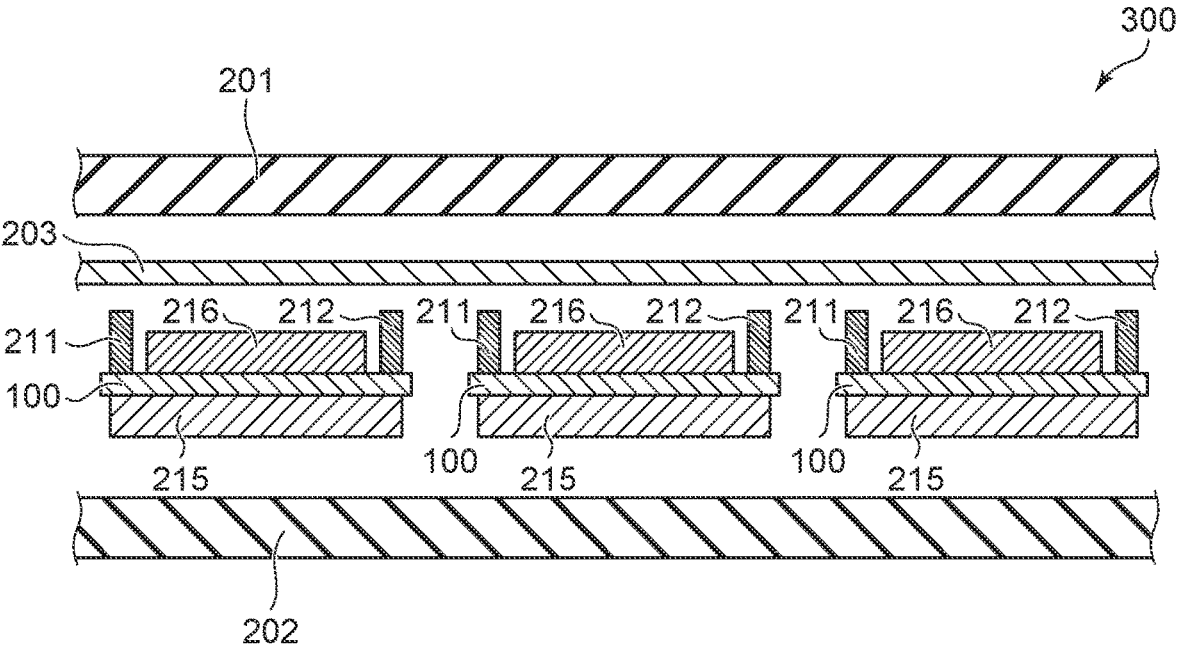
FIG. 7

IGBT DEVICE WITH ELECTRODE PADS OF VARIED SHAPE TO DISCRIMINATE PADS IN CHIP OPERATION AND TESTING

CROSS-REFERENCE TO RELATED APPLICATIONS

This application is based upon and claims the benefit of priority from Japanese Patent Application No. 2023-030200, filed on Feb. 28, 2023; the entire contents of which are incorporated herein by reference.

FIELD

Embodiments relate to a semiconductor device.

BACKGROUND

There are cases where multiple electrode pads are provided in a semiconductor device such as an IGBT (Insulated Gate Bipolar Transistor) or the like. It is desirable to easily distinguish between the electrode pads.

BRIEF DESCRIPTION OF THE DRAWINGS

FIGS. 6A and 6B are schematic views illustrating operations of the semiconductor device according to the embodiment; and FIG. 7 is a schematic cross-sectional view illustrating a semiconductor module including the semiconductor device according to the embodiment.

DETAILED DESCRIPTION

Figure 1:
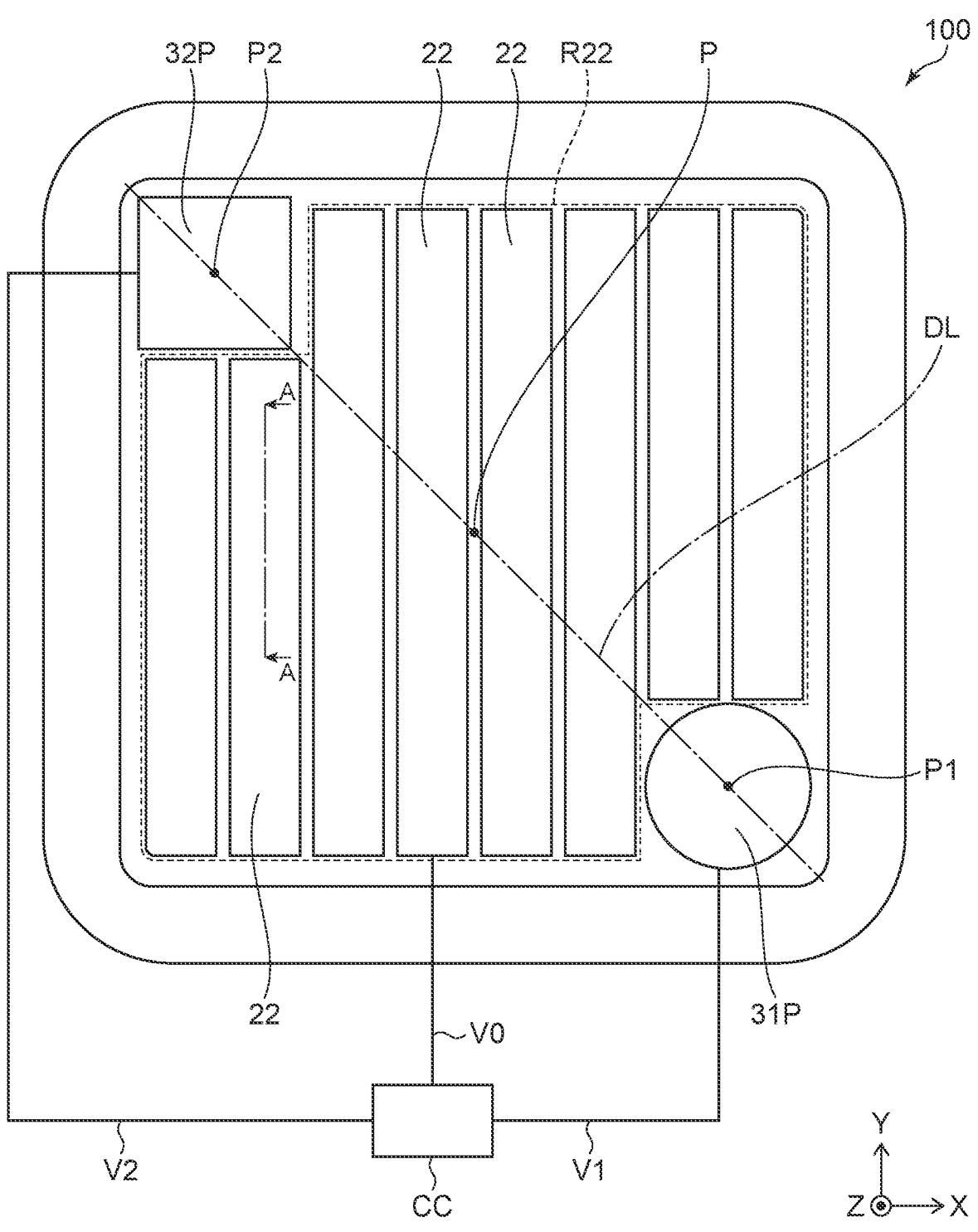
FIG. 1 is a schematic plan view illustrating a semiconductor device according to an embodiment.

A semiconductor device according to one embodiment, includes a first electrode, a first semiconductor region, a second semiconductor region, a third semiconductor region, a fourth semiconductor region, a first control electrode, a second control electrode, a second electrode, a first electrode pad, and a second electrode pad. The first semiconductor region is located on the first electrode. The first semiconductor region is of a first conductivity type. The second semiconductor region is located on the first semiconductor region. The second semiconductor region is of a second conductivity type. The third semiconductor region is located on the second semiconductor region. The third semiconductor region is of the first conductivity type. The fourth semiconductor region is located on a portion of the third semiconductor region. The fourth semiconductor region is of the second conductivity type. The first control electrode faces the second, third, and fourth semiconductor regions via a first insulating film. The second control electrode is separated from the first control electrode in a second direction perpendicular to a first direction. The first direction is from the first electrode toward the first semiconductor region. The second control electrode is electrically isolated from the first control electrode. The second control electrode faces the second and third semiconductor regions via a second insulating film. The second electrode is positioned above the third and fourth semiconductor regions. The second electrode is electrically connected with the third and fourth semiconductor regions. The first electrode pad is electrically connected with the first control electrode. The second electrode pad is electrically connected with the second control electrode. The second electrode pad has a different planar shape from the first electrode pad.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, n, $n^-$, $p^+$, and p indicate relative levels of the impurity concentrations. In other words, a notation marked with "+" indicates that the impurity concentration is relatively greater than that of a notation not marked with either "+" or "−", and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In the embodiments described below, each embodiment may be implemented by inverting the p-type (an example of the first conductivity type) and the n-type (an example of the second conductivity type) of each semiconductor region.

FIG. 1 is a schematic plan view illustrating a semiconductor device according to an embodiment.

Figure 2:
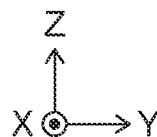
FIG. 2 is a schematic cross-sectional view illustrating the semiconductor device according to the embodiment.

FIG. 2 is a schematic cross-sectional view illustrating the semiconductor device according to the embodiment.

FIG. 2 corresponds to a cross section along line A-A shown in FIG. 1. Some of the components such as a first wiring part 51, a second wiring part 52, and the like (described below with reference to FIG. 3 and other figures) are not illustrated in FIG. 1.

As illustrated in FIG. 2, the semiconductor device 100 includes a first electrode 21, a semiconductor layer 10, a second electrode 22, multiple first control electrodes 31, and multiple second control electrodes 32. The semiconductor layer 10 includes a first semiconductor region 11, a second semiconductor region 12, a third semiconductor region 13, and multiple fourth semiconductor regions 14. The semiconductor device 100 according to the embodiment is, for example, a semiconductor chip that includes an IGBT.

An XYZ orthogonal coordinate system is used in the description of embodiments. The direction from the first electrode 21 toward the second electrode 22 is taken as a Z-direction (a first direction). Two mutually-orthogonal directions perpendicular to the Z-direction are taken as an X-direction (a third direction) and a Y-direction (a second direction). In the description, the direction from the first electrode 21 toward the second electrode 22 is called "up", and the opposite direction is called "down". These directions are based on the relative positional relationship between the first electrode 21 and the second electrode 22 and are independent of the direction of gravity.

The first electrode 21 is, for example, a collector electrode. The first electrode 21 is located at a lower surface 10s side of the semiconductor layer 10. The second electrode 22 is, for example, an emitter electrode. The second electrode 22 is located at an upper surface 10u side of the semiconductor layer 10.

The first semiconductor region 11 is located on the first electrode 21 and is of a first conductivity type (a p-type). The first semiconductor region 11 is electrically connected with the first electrode 21. The first semiconductor region 11 is, for example, a p⁺-type collector region.

The second semiconductor region 12 is located on the first semiconductor region 11 and is of a second conductivity type (an n-type). The second semiconductor region 12 is electrically connected with the first semiconductor region 11. The second semiconductor region 12 is, for example, an n-type base region.

The third semiconductor region 13 is located on the second semiconductor region 12 and is of the first conductivity type. The third semiconductor region 13 is electrically connected with the second semiconductor region 12. The third semiconductor region 13 is, for example, a p-type base region.

A semiconductor region 12B of the second conductivity type may be located between the second semiconductor region 12 and the third semiconductor region 13. The second-conductivity-type impurity concentration of the semiconductor region 12B is greater than the second-conductivity-type impurity concentration of the second semiconductor region 12. The semiconductor region 12B is, for example, an n-type barrier layer.

The fourth semiconductor region 14 is located on a portion of the third semiconductor region 13 and is of the second conductivity type. A portion (a semiconductor part 13c) of the third semiconductor region 13 is positioned between the fourth semiconductor region 14 and the second semiconductor region 12. The fourth semiconductor region 14 is, for example, an n⁺-type emitter region.

In the example, the semiconductor layer 10 further includes multiple fifth semiconductor regions 15 and multiple sixth semiconductor regions 16. The fifth semiconductor region 15 is located on a portion of the third semiconductor region 13 and is of the first conductivity type. A portion (a semiconductor part 13d) of the third semiconductor region 13 is positioned between the fifth semiconductor region 15 and the second semiconductor region 12. The fifth semiconductor region 15 is separated from the fourth semiconductor region 14 in the Y-direction. The first-conductivity-type impurity concentration of the fifth semiconductor region 15 is greater than the first-conductivity-type impurity concentration of the third semiconductor region 13. The fifth semiconductor region 15 is, for example, a p⁺-type region.

The sixth semiconductor region 16 is located on a portion of the third semiconductor region 13 and is of the first conductivity type. For example, the sixth semiconductor region 16 is arranged in the Y-direction with the fourth semiconductor region 14 and contacts the fourth semiconductor region 14. The first-conductivity-type impurity concentration of the sixth semiconductor region 16 is greater than the first-conductivity-type impurity concentration of the third semiconductor region 13. The sixth semiconductor region 16 is, for example, a p⁺-type region.

A trench T1 that extends in the Z-direction and reaches the second semiconductor region 12 is provided in the upper surface 10u side of the semiconductor layer 10. A first insulating film 81 is located along the inner wall of the trench T1. The first control electrode 31 is stacked inside the trench T1 at the inner side of the first insulating film 81 and contacts the first insulating film 81. The first control electrode 31 is insulated from the semiconductor layer 10 by the first insulating film 81.

The first control electrode 31 faces the fourth semiconductor region 14, the third semiconductor region 13 (the semiconductor part 13c), and a portion of the second semiconductor region 12 via the first insulating film 81. That is, the first control electrode 31 is arranged in the Y-direction with the fourth semiconductor region 14, the third semiconductor region 13 (the semiconductor part 13c), and a portion of the second semiconductor region 12. The first insulating film 81 contacts the second semiconductor region 12, the third semiconductor region 13 (the semiconductor part 13c), and the fourth semiconductor region 14. For example, the first control electrode 31 is a gate electrode; and the first insulating film 81 is a gate insulating film.

A trench T2 that extends in the Z-direction and reaches the second semiconductor region 12 is provided in the upper surface 10u side of the semiconductor layer 10. The trench T2 is separated from the trench T1 in the Y-direction. A second insulating film 82 is located along the inner wall of the trench T2. The second control electrode 32 is stacked inside the trench T2 at the inner side of the second insulating film 82 and contacts the second insulating film 82. The second control electrode 32 is insulated from the semiconductor layer 10 by the second insulating film 82.

The second control electrode 32 faces the fifth semiconductor region 15, the third semiconductor region 13 (the semiconductor part 13d), and a portion of the second semiconductor region 12 via the second insulating film 82. That is, the second control electrode 32 is arranged in the Y-direction with the fifth semiconductor region 15, the third semiconductor region 13 (the semiconductor part 13d), and a portion of the second semiconductor region 12. The second insulating film 82 contacts the second semiconductor region 12, the third semiconductor region 13 (the semiconductor part 13d), and the fifth semiconductor region 15. For example, the second control electrode 32 is a gate electrode; and the second insulating film 82 is a gate insulating film. A semiconductor region of the second conductivity type that contacts the second insulating film 82 may not be provided on the third semiconductor region 13.

Thus, the second control electrode 32 is separated from the first control electrode 31 in the Y-direction and is electrically isolated from the first control electrode 31. In other words, the configuration is such that a different voltage from the first control electrode 31 can be applied to the second control electrode 32.

The second electrode 22 is positioned above the third semiconductor region 13, the fourth semiconductor region 14, the fifth semiconductor region 15, and the sixth semiconductor region 16. The second electrode 22 is electrically connected with the third semiconductor region 13, the fourth semiconductor region 14, the fifth semiconductor region 15, and the sixth semiconductor region 16.

For example, an insulating film 70 and a conductive contact portion 41 are located between the semiconductor layer 10 and the second electrode 22. For example, one contact portion 41 contacts the upper surfaces of the fourth and sixth semiconductor regions 14 and 16 and contacts the lower surface of the second electrode 22. Accordingly, the contact portion 41 electrically connects the fourth semiconductor region 14, the sixth semiconductor region 16, and the second electrode 22. For example, one other contact portion 41 contacts the upper surfaces of the third and fifth semiconductor regions 13 and 15 and contacts the lower surface of the second electrode 22. Accordingly, the contact portion 41 electrically connects the third semiconductor region 13, the fifth semiconductor region 15, and the second electrode 22.

For example, the contact portion 41 may not directly contact the third semiconductor region 13; and the second electrode 22 may be electrically connected with the third semiconductor region 13 via at least one of the fourth semiconductor region 14, the fifth semiconductor region 15, or the sixth semiconductor region 16.

The insulating film 70 is located on the trenches T1 and T2 and on the fourth semiconductor region 14, the fifth semiconductor region 15, and the sixth semiconductor region 16. The second electrode 22 is insulated from the first and second control electrodes 31 and 32.

The semiconductor device 100 may be an RC (reverse-conducting)-IGBT. In other words, an n⁺-type semiconductor region (not illustrated) may be located between the first electrode 21 and the second semiconductor region 12. The n⁺-type semiconductor region is arranged with the first semiconductor region 11 in the X-direction or Y-direction and contacts the first electrode 21 and the second semiconductor region 12.

As illustrated in FIG. 1, the semiconductor device 100 includes a first electrode pad 31P and a second electrode pad 32P. For example, the first electrode pad 31P and the second electrode pad 32P are positioned above the semiconductor layer 10. For example, the first electrode pad 31P and the second electrode pad 32P are located on the semiconductor layer 10 and located on the insulating film.

The planar shape of the first electrode pad 31P is different from the planar shape of the second electrode pad 32P. The planar shape refers to the shape in the X-Y plane perpendicular to the Z-direction; in other words, the planar shape is the shape when viewed in plan along the Z-direction. In the example of FIG. 1, the planar shape of the first electrode pad 31P is circular. The planar shape of the first electrode pad 31P is not limited to an exact perfect circle and may be, for example, a flattened circle. In the example of FIG. 1, the planar shape of the second electrode pad 32P is polygonal, and more specifically, a rectangle (e.g., a square). The polygon or rectangle is not limited to an exact polygon or rectangle and may be, for example, a shape having rounded corners.

The thickness (the length along the Z-direction) of the first electrode pad 31P may be equal to the thickness of the second electrode pad 32P. The material of the first electrode pad 31P may be the same as the material of the second electrode pad 32P.

As in FIG. 1, the first electrode pad 31P and the second electrode pad 32P are arranged to be point-symmetric in the X-Y plane (when viewed in plan along the Z-direction) with respect to a center P of the semiconductor device 100 (e.g., the centroid of the planar shape of the semiconductor chip). That is, the first electrode pad 31P and the second electrode pad 32P are positioned on a diagonal DL of the semiconductor device 100. The center P of the semiconductor device 100 is positioned between the first electrode pad 31P and the second electrode pad 32P. The shape of the semiconductor device 100 is quadrilateral (e.g., rectangular) when viewed in plan along the Z-direction.

More specifically, for example, when viewed in plan, a point P1 inside the region in which the first electrode pad 31P is located (e.g., the centroid of the planar shape of the first electrode pad 31P) and a point P2 inside the region in which the second electrode pad 32P is located (e.g., the centroid of the planar shape of the second electrode pad 32P)

are arranged to be point-symmetric with respect to the center P of the semiconductor device 100.

For example, when viewed in plan, the shape of a region R22 in which the second electrode 22 is located may be point-symmetric with respect to the center P of the semiconductor device 100. The center P and the diagonal DL of the semiconductor device 100 may be respectively the center and diagonal of the semiconductor layer 10.

For example, the first electrode pad 31P and the second electrode pad 32P are located in the same plane. For example, the first electrode pad 31P extends along the X-Y plane. For example, the second electrode pad 32P extends along the X-Y plane. For example, the first electrode pad 31P and the second electrode pad 32P are on the same X-Y plane. For example, the second electrode 22 extends along the X-Y plane. For example, the upper surface of the semiconductor layer 10 and the upper surface of the second electrode 22 may be surfaces along the X-Y plane (e.g., surfaces parallel to the X-Y plane).

Figure 3:
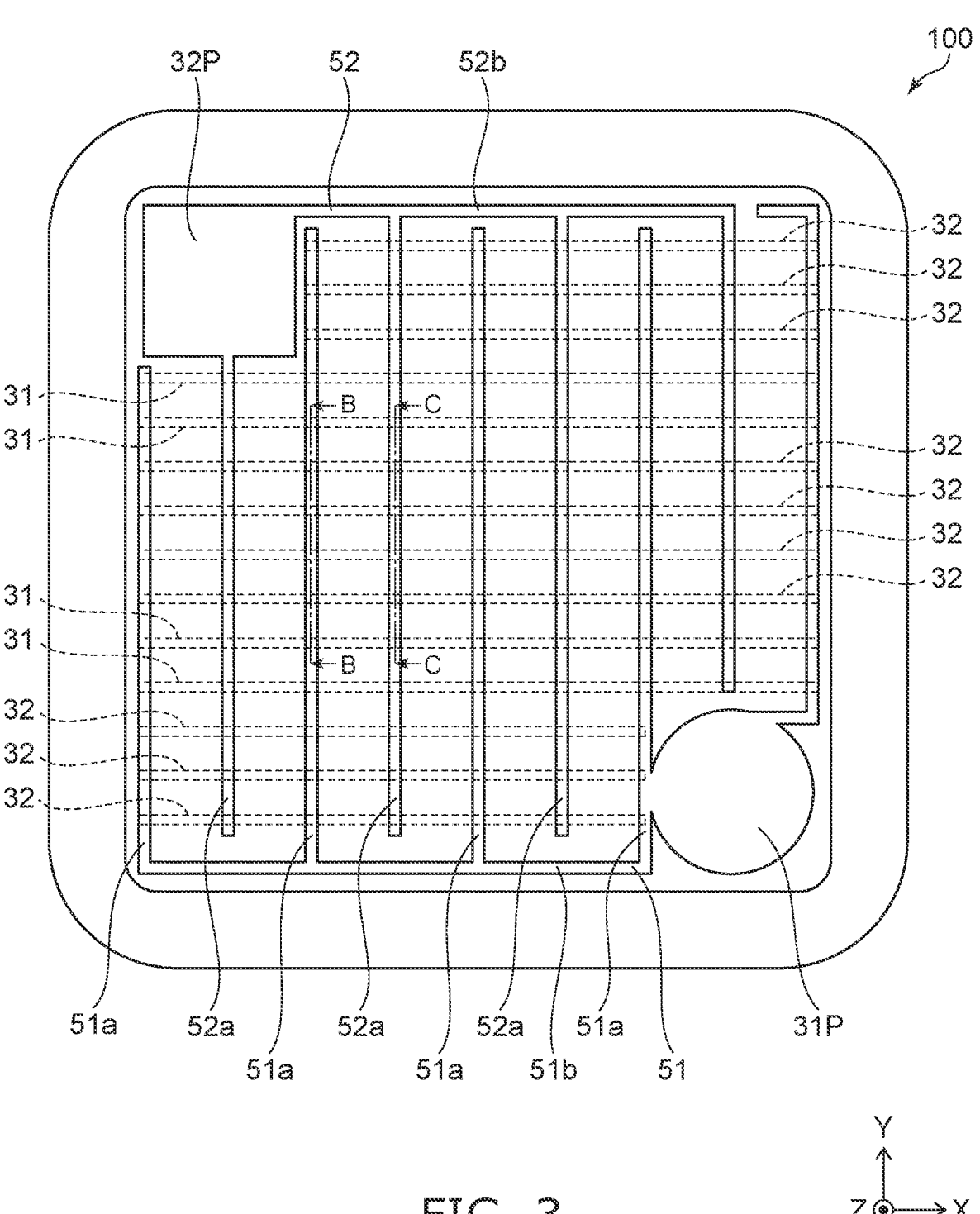
FIG. 3 is a schematic plan view illustrating the semiconductor device according to the embodiment.

FIG. 3 is a schematic plan view illustrating the semiconductor device according to the embodiment.

As illustrated in FIG. 3, the semiconductor device 100 includes the first wiring part 51 and the second wiring part 52. FIG. 3 illustrates the planar arrangement of the first control electrode 31, the second control electrode 32, the first electrode pad 31P, the second electrode pad 32P, the first wiring part 51, and the second wiring part 52. Some of the components such as the second electrode 22, etc., are not illustrated in FIG. 3.

The multiple first control electrodes 31 are arranged in the Y-direction; and each first control electrode 31 extends in the X-direction. The multiple second control electrodes 32 are arranged in the Y-direction; and each second control electrode 32 extends in the X-direction. The example illustrated in FIG. 3 is an example; for example, the numbers of the first and second control electrodes 31 and 32 and the shapes of the first and second wiring parts 51 and 52 are not limited thereto.

The first wiring part 51 includes, for example, multiple first gate wiring parts 51a and a first interconnect part 51b. The multiple first gate wiring parts 51a are arranged in the X-direction; and each first gate wiring part 51a extends in the Y-direction. The first interconnect part 51b extends in the X-direction and electrically connects the first electrode pad 31P with the Y-direction end portions of the first gate wiring parts 51a. Some of the first gate wiring parts 51a may be directly connected to the first electrode pad 31P without the first interconnect part 51b interposed.

The second wiring part 52 includes, for example, multiple second gate wiring parts 52a and a second interconnect part 52b. The multiple second gate wiring parts 52a are arranged in the X-direction; and each second gate wiring part 52a extends in the Y-direction. The second interconnect part 52b extends in the X-direction and electrically connects the second electrode pad 32P with the Y-direction end portions of the second gate wiring part 52a. Some of the second gate wiring parts 52a may be directly connected to the second electrode pad 32P without the second interconnect part 52b interposed.

The first gate wiring part 51a and the second gate wiring part 52a are alternately arranged along the X-direction between the first interconnect part 51b and the second interconnect part 52b. The first wiring part 51 and the second wiring part 52 each are arranged in the X-direction or Y-direction with the second electrode 22 described with reference to FIG. 1 and other figures, and are insulated from the second electrode 22.

Figure 4:
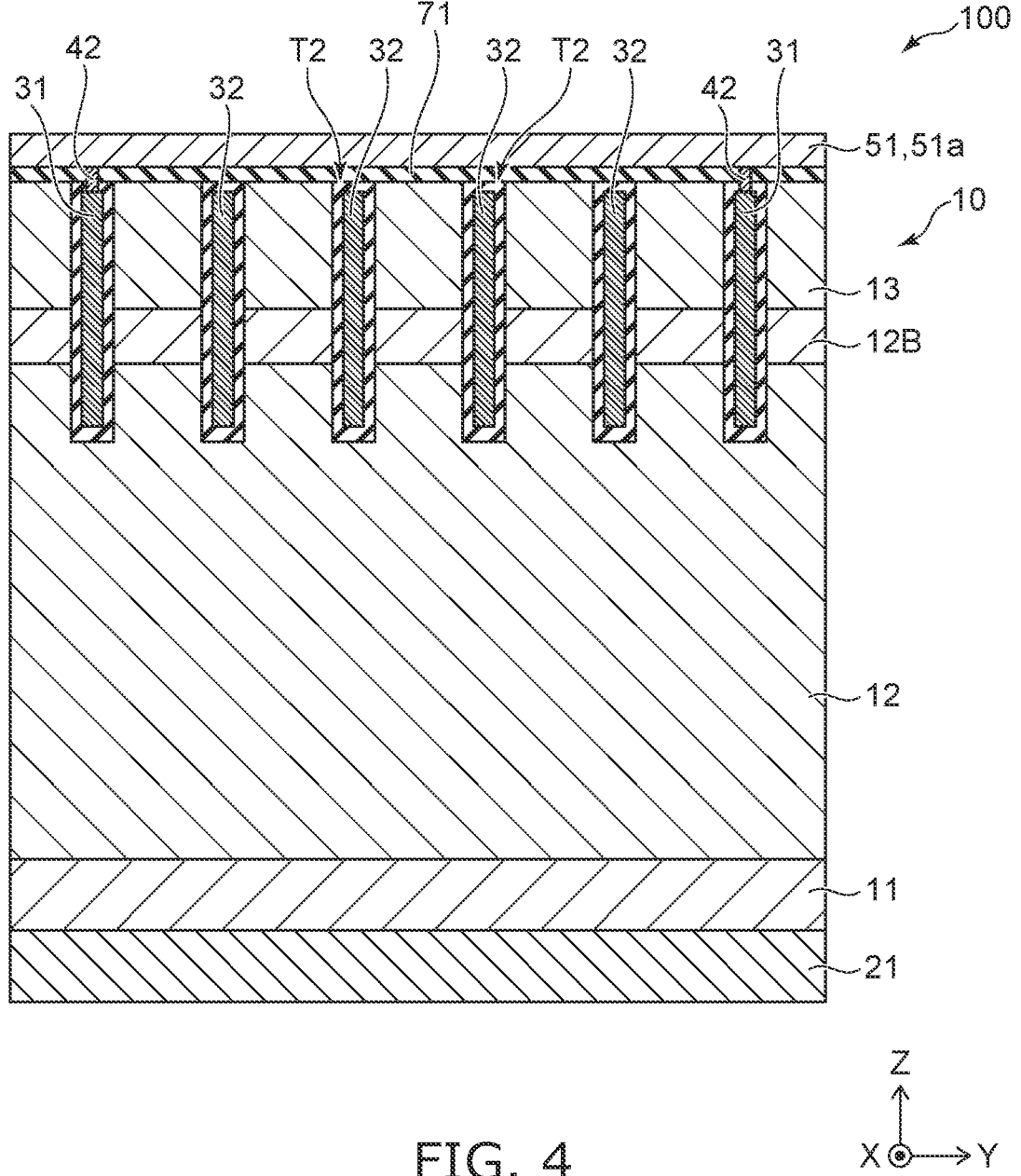
FIG. 4 is a schematic cross-sectional view illustrating the semiconductor device according to the embodiment.

FIG. 4 is a schematic cross-sectional view illustrating the semiconductor device according to the embodiment.

FIG. 4 corresponds to a cross section along line B-B illustrated in FIG. 3. As illustrated in FIG. 4, the first wiring part 51 is positioned above the third semiconductor region 13, the multiple first control electrodes 31, and the multiple second control electrodes 32.

For example, an insulating film 71 and a conductive contact portion 42 are located between the semiconductor layer 10 and the first wiring part 51. One contact portion 42 contacts the upper surface of one first control electrode 31 and contacts the lower surface of the first gate wiring part 51a. Accordingly, the contact portion 42 electrically connects the first control electrode 31 and the first gate wiring part 51a. One first gate wiring part 51a (the first wiring part 51) is electrically connected with multiple first control electrodes 31.

The insulating film 71 is located on the trench T2 and on the third semiconductor region 13. The first gate wiring part 51a (the first wiring part 51) is insulated from the second control electrode 32.

Figure 5:
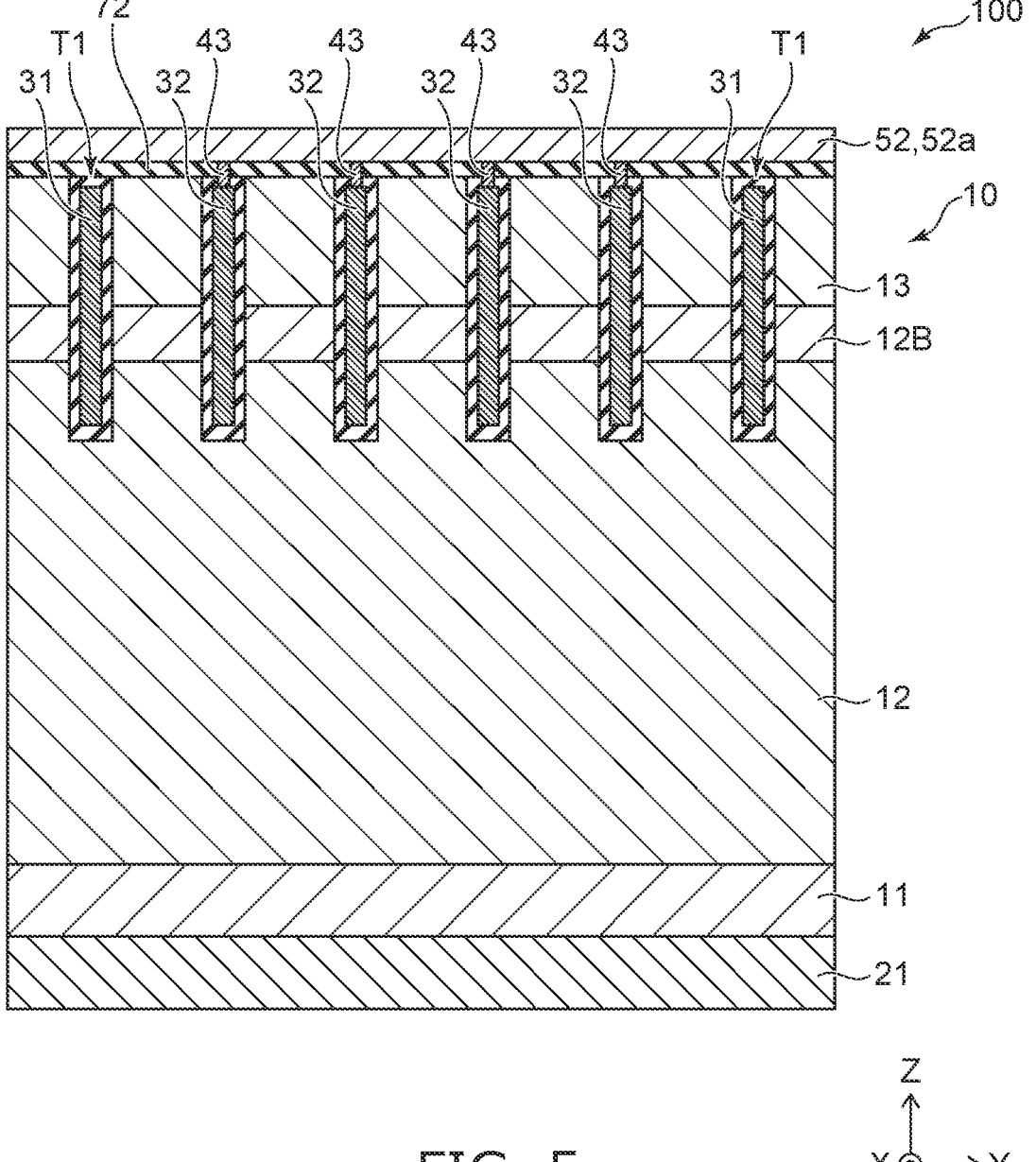
FIG. 5 is a schematic cross-sectional view illustrating the semiconductor device according to the embodiment.

FIG. 5 is a schematic cross-sectional view illustrating the semiconductor device according to the embodiment.

FIG. 5 corresponds to a cross section along line C-C illustrated in FIG. 3. As illustrated in FIG. 5, the second wiring part 52 is positioned above the third semiconductor region 13, the multiple first control electrodes 31, and the multiple second control electrodes 32.

For example, an insulating film 72 and a conductive contact portion 43 are located between the semiconductor layer 10 and the second wiring part 52. One contact portion 43 contacts the upper surface of one second control electrode 32 and contacts the lower surface of the second gate wiring part 52a. The contact portion 43 thereby electrically connects the second control electrode 32 and the second gate wiring part 52a. One second gate wiring part 52a (the second wiring part 52) is electrically connected with the multiple second control electrodes 32.

The insulating film 72 is located on the trench T1 and on the third semiconductor region 13. The second gate wiring part 52a (the second wiring part 52) is insulated from the first control electrode 31.

As described with reference to FIGS. 3 to 5, the first electrode pad 31P is electrically connected with the first control electrode 31 via the first wiring part 51. The second electrode pad 32P is electrically connected with the second control electrode 32 via the second wiring part 52. For example, the first electrode pad 31P and the second electrode pad 32P are exposed at the upper surface of the semiconductor device 100 and are configured to be connectable to external terminals. A voltage can be applied to the first control electrode 31 by applying the voltage to the first electrode pad 31P via an external terminal. Similarly, a voltage can be applied to the second control electrode 32 by applying the voltage to the second electrode pad 32P via the external terminal.

An example of materials of the components of the semiconductor device 100 will now be described.

The semiconductor regions (the first to sixth semiconductor regions 11 to 16, etc.) of the semiconductor layer 10 include silicon, silicon carbide, gallium nitride, or gallium arsenide as a semiconductor material. When silicon is used as the semiconductor material, arsenic, phosphorus, or antimony can be used as an n-type impurity. Boron can be used as the p-type impurity.

The first control electrode 31 and the second control electrode 32 include a conductive material such as polysilicon, etc.

The first insulating film 81, the second insulating film 82, and the insulating films 70 to 72 include an insulating material such as silicon oxide, etc.

The first electrode 21, the second electrode 22, the first wiring part 51, the second wiring part 52, the first electrode pad 31P, and the second electrode pad 32P include a metal such as aluminum, etc.

An operation of the semiconductor device 100 will now be described.

A voltage that is not less than a threshold is applied to the first and second control electrodes 31 and 32 (e.g., the gate electrodes) in a state in which a positive voltage with respect to the second electrode 22 (e.g., the emitter electrode) is applied to the first electrode 21 (e.g., the collector electrode). Accordingly, an inversion layer (an n-type inversion layer) is formed in the third semiconductor region 13 (e.g., the p-type base region); and an IGBT operation is started. For example, a channel (an inversion layer) is formed in the region facing the first control electrode 31 of the third semiconductor region 13. For example, electrons flow from the second electrode 22 via the fourth semiconductor region 14 (e.g., the source region) and the channel toward the second semiconductor region 12. For example, holes flow from the first electrode 21 via the first semiconductor region 11 (e.g., the collector region) toward the second semiconductor region 12. Subsequently, when the voltages applied to the first and second control electrodes 31 and 32 are less than the threshold, the inversion layer in the third semiconductor region 13 disappears, and the IGBT operation ends.

For example, the semiconductor device 100 is electrically connected with a controller CC as illustrated by the schematic circuit diagram of FIG. 1. The controller CC includes, for example, a control circuit such as a CPU, etc. The controller CC is electrically connected with the first control electrode 31 via the first electrode pad 31P and the first wiring part 51. The controller CC is electrically connected with the second control electrode 32 via the second electrode pad 32P and the second wiring part 52. The controller CC is electrically connected with the second electrode 22.

The controller CC sets the second electrode 22 to a reference potential V0. The reference potential V0 is, for example, a ground potential. For example, a voltage VCE is applied to the first electrode 21. The controller CC applies a voltage V1 to the first control electrode 31. The controller CC applies a voltage V2 to the second control electrode 32.

FIGS. 6A and 6B are schematic views illustrating operations of the semiconductor device according to the embodiment.

In FIGS. 6A and 6B, the horizontal axis is a time tm. FIGS. 6A and 6B illustrate the voltage V1 and the voltage V2 in the IGBT operation of the semiconductor device 100. For example, the voltage V1 and the voltage V2 are positive (the on-state) before a time tm1. At this time, for example, an n-type inversion layer is formed at the interface between the third semiconductor region 13 and the first insulating film 81 and the interface between the third semiconductor region 13 and the second insulating film 82. For example, electrons flow from the second electrode 22 toward the second semiconductor region 12 via the n-type inversion layer formed at the interface between the third semiconductor region 13 and the first insulating film 81.

For example, the voltage V2 is switched from positive to negative (the off-state) at the time tm1. Accordingly, for example, at the interface between the third semiconductor region 13 and the second insulating film 82, the n-type inversion layer disappears, and a p-type accumulation layer is formed. For example, at a time tm2 after the time tm1, the voltage V1 is switched from positive to negative (the off-state). Accordingly, for example, at the interface between the third semiconductor region 13 and the first insulating film 81, the n-type inversion layer disappears, and a p-type accumulation layer is formed. The potential of the first control electrode 31 or the second control electrode 32 in the off-state is less than the potential of the first control electrode 31 or the second control electrode 32 in the on-state. For example, the potential of the first control electrode 31 or the second control electrode 32 in the off-state is less than the potential (the reference potential V0) of the second electrode 22. For example, at a time tm3 after the time tm2, the voltage V1 and the voltage V2 change from negative to positive.

Thus, the controller CC sets the second control electrode 32 to the off-state before the first control electrode 31 is switched to the off-state. By such an operation, for example, the loss when setting the semiconductor device 100 to the off-state can be reduced. For example, in a period TD1 between the time tm1 and the time tm2, holes are discharged from the second semiconductor region 12 to the second electrode 22 via the p-type accumulation layer formed at the interface between the third semiconductor region 13 and the second insulating film 82. By controlling the concentration of the accumulated carriers, for example, the loss when setting the first control electrode 31 to the off-state can be reduced. As an example, the length of the period TD1 (the difference between the time tm1 and the time tm2) can be set to be not less than 5 μsecond and not more than 100 μsecond.

FIG. 7 is a schematic cross-sectional view illustrating a semiconductor module including the semiconductor device according to the embodiment.

FIG. 7 schematically illustrates a state in which a portion of the semiconductor module 300 according to the embodiment is disassembled.

As illustrated in FIG. 7, the semiconductor module 300 has a structure in which a first member 201, a wiring substrate 203, the multiple semiconductor devices 100, and a second member 202 overlap. The first member 201 is, for example, a housing that includes an insulating body. The second member 202 is, for example, a capping member that includes an insulating body. Although not illustrated, intermediate members such as a frame, a guide, or the like that regulates the positions of the insulating substrates, the semiconductor device 100, etc., may be provided as necessary between the first member 201 and the second member 202. The semiconductor device 100 is held by being indirectly sandwiched between the first member 201 and the second member 202. In other words, the semiconductor device 100 is held by being sandwiched between members located between the first member 201 and the second member 202. For example, the semiconductor device 100 is pressed onto the wiring substrate 203.

Specifically, in the example, the first electrode pad 31P of the semiconductor device 100 is connected to the wiring substrate 203 via a conductive member 211 (a probe pin). The second electrode pad 32P of the semiconductor device 100 is connected to the wiring substrate 203 via a conductive member 212 (a probe pin). The first electrode 21 is exposed at the surface of the semiconductor device 100 and connected to a conductive plate 215. The conductive plate 215 is insulated from the wiring substrate 203. The second electrode 22 is exposed at the surface of the semiconductor device 100 and connected to a conductive plate 216. For example, the conductive plate 216 is electrically connected with the wiring substrate 203 via a not-illustrated conductive part. The semiconductor device 100 and the wiring substrate 203 are pressed toward each other. In other words, the semiconductor device 100 is indirectly pressed onto the wiring substrate 203 by the conductive member 211, the conductive member 212, etc. The semiconductor module 300 is, for example, a module assembled by pressure-welding.

Effects of the embodiment will now be described.

In the semiconductor device 100 as described with reference to FIG. 1 and other figures, the planar shape of the first electrode pad 31P is different from the planar shape of the second electrode pad 32P. The first electrode pad 31P and the second electrode pad 32P are easily distinguished thereby.

According to the embodiment as described with reference to FIG. 1, the first electrode pad 31P and the second electrode pad 32P are arranged to be point-symmetric. In other words, the first electrode pad 31P and the second electrode pad 32P are positioned on the diagonal DL of the semiconductor device 100; and the center P of the semiconductor device 100 is positioned between the first electrode pad 31P and the second electrode pad 32P. Accordingly, the pressure that is applied to the semiconductor device 100 is easily made uniform when mounting the semiconductor device 100 to the wiring substrate 203. For example, as described with reference to FIG. 7, bias of the pressure applied to the semiconductor device 100 can be suppressed when the semiconductor device 100 is pressed onto the wiring substrate 203 by pressure-welding. For example, the layout of the wiring parts of the wiring substrate 203 can be easily designed.

When, however, the first electrode pad 31P and the second electrode pad 32P are arranged to be point-symmetric, for example, if the orientation of the semiconductor device 100 is changed, there is a risk that the first electrode pad 31P and the second electrode pad 32P may be difficult to discriminate in chip testing, visual inspection, etc. In contrast, according to the embodiment, the planar shape of the first electrode pad 31P is different from the planar shape of the second electrode pad 32P as described above. The first electrode pad 31P and the second electrode pad 32P are easily distinguished thereby.

Here, the electrical capacitance between the first electrode pad 31P and the second electrode 22 is taken as a first gate capacitance (a first electrical capacitance). The electrical capacitance between the second electrode pad 32P and the second electrode 22 is taken as a second gate capacitance (a second electrical capacitance). For example, as illustrated in FIG. 3 and other figures, the number of the second control electrodes 32 is greater than the number of the first control electrodes 31. In such a case, the second gate capacitance is greater than the first gate capacitance. As described with reference to FIGS. 6A and 6B, by setting the second control electrode 32 to the off-state before the first control electrode 31, the holes can be discharged, and the loss can be reduced. The large number of the second control electrodes 32 makes it easier to discharge the holes and reduce the loss further. For example, the number of the second control electrodes 32 is not less than 1 times and not more than 11 times, and favorably not less than 6 times and not more than 11 times the number of the first control electrodes 31. For example, one to eleven second control electrodes 32 can be located between two adjacent first control electrodes 31 among the multiple first control electrodes 31. According to the embodiment, the first gate capacitance may be greater than the second gate capacitance.

The electrical resistance inside the semiconductor device 100 to the current flowing in the semiconductor device 100 via the first electrode pad 31P is taken as a first gate internal resistance (a first electrical resistance). To measure the first gate internal resistance, for example, the voltage of the first electrode pad 31P with respect to the potential of the second electrode 22 is changed. At this time, the electrical resistance of the semiconductor device 100 to the current flowing into the semiconductor device 100 (or flowing out of the semiconductor device 100) via the first electrode pad 31P can be used as the first gate internal resistance. The resistance component due to the first electrode pad 31P, the resistance component due to the first wiring part 51, and the resistance component due to the first control electrode 31 are included in the first gate internal resistance. When measuring the first gate internal resistance, a prescribed positive voltage VCE with respect to the potential of the second electrode 22 may be applied to the first electrode 21; and the second electrode pad 32P may be in a state in which a first prescribed voltage is applied (e.g., the second control electrode 32 is in the off-state).

Similarly, the electrical resistance inside the semiconductor device 100 to the current flowing in the semiconductor device 100 via the second electrode pad 32P is taken as a second gate internal resistance (a second electrical resistance). To measure the second gate internal resistance, for example, the voltage of the second electrode pad 32P with respect to the potential of the second electrode 22 is changed. At this time, the electrical resistance of the semiconductor device 100 to the current flowing into the semiconductor device 100 (or flowing out of the semiconductor device 100) via the second electrode pad 32P can be used as the second gate internal resistance. The resistance component due to the second electrode pad 32P, the resistance component due to the second wiring part 52, and the resistance component due to the second control electrode 32 are included in the second gate internal resistance. When measuring the second gate internal resistance, a prescribed positive voltage VCE with respect to the potential of the second electrode 22 may be applied to the first electrode 21; and the first electrode pad 31P may be in a state in which the first prescribed voltage is applied (e.g., the first control electrode 31 is in the off-state).

For example, when the first gate capacitance is greater than the second gate capacitance, it is desirable for the first gate internal resistance to be less than the second gate internal resistance. When the first gate capacitance is greater than the second gate capacitance, the current that flows through the first electrode pad 31P easily exceeds the current flowing through the second electrode pad 32P. In such a case, by setting the first gate internal resistance to be relatively small, the power loss when a large current flows can be suppressed.

Conversely, when the second gate capacitance is greater than the first gate capacitance, it is desirable for the second gate internal resistance to be less than the first gate internal resistance. When the second gate capacitance is greater than the first gate capacitance, the current that flows through the second electrode pad 32P easily exceeds the current flowing through the first electrode pad 31P. In such a case, by setting the second gate internal resistance to be relatively small, the power loss when a large current flows can be suppressed.

For example, the area of the first electrode pad 31P is different from the area of the second electrode pad 32P. The area of the electrode pad is the area of the electrode pad when viewed in plan along the Z-direction.

For example, when the first gate capacitance is greater than the second gate capacitance, it is desirable for the area of the first electrode pad 31P to be greater than the area of the second electrode pad 32P. By setting the area of the first electrode pad 31P to be relatively large, the resistance component of the first electrode pad 31P can be reduced. The power loss when a relatively large current flows in the first electrode pad 31P can be suppressed.

Conversely, when the second gate capacitance is greater than the first gate capacitance, it is desirable for the area of the second electrode pad 32P to be greater than the area of the first electrode pad 31P. By setting the area of the second electrode pad 32P to be relatively large, the resistance component of the second electrode pad 32P can be reduced. The power loss when a relatively large current flows in the second electrode pad 32P can be suppressed.

In other words, for example, when the first gate capacitance is greater than the second gate capacitance, the resistance component of the first electrode pad 31P is less than the resistance component of the second electrode pad 32P; and when the second gate capacitance is greater than the first gate capacitance, the resistance component of the second electrode pad 32P is less than the resistance component of the first electrode pad 31P. The resistance component of the first electrode pad 31P is, for example, the electrical resistance of the first electrode pad 31P in a current path from one first control electrode 31 toward the external circuit via the first electrode pad 31P. Similarly, the resistance component of the second electrode pad 32P is, for example, the electrical resistance of the second electrode pad 32P in a current path from one second control electrode 32 toward the external circuit via the second electrode pad 32P.

In the example as described above, the second gate capacitance is greater than the first gate capacitance. Therefore, as illustrated in FIG. 1 and other figures, the area of the second electrode pad 32P is greater than the area of the first electrode pad 31P.

The embodiments may include the following configurations.

Configuration 1 A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type;

a third semiconductor region located on the second semiconductor region, the third semiconductor region being of the first conductivity type;

a fourth semiconductor region located on a portion of the third semiconductor region, the fourth semiconductor region being of the second conductivity type;

a first control electrode facing the second, third, and fourth semiconductor regions via a first insulating film;

a second control electrode separated from the first control electrode in a second direction perpendicular to a first direction, the first direction being from the first electrode toward the first semiconductor region, the second control electrode being electrically isolated from the first control electrode, the second control electrode facing the second and third semiconductor regions via a second insulating film;

a second electrode positioned above the third and fourth semiconductor regions, the second electrode being electrically connected with the third and fourth semiconductor regions;

a first electrode pad electrically connected with the first control electrode; and a second electrode pad electrically connected with the second control electrode, the second electrode pad having a different planar shape from the first electrode pad.

Configuration 2

The semiconductor device according to Configuration 1, wherein an area of the first electrode pad is different from an area of the second electrode pad.

Configuration 3

The semiconductor device according to Configuration 1 or 2, wherein a first electrical capacitance between the first electrode pad and the second electrode is greater than a second electrical capacitance between the second electrode pad and the second electrode, and a first electrical resistance of the semiconductor device when a current flows in the semiconductor device via the first electrode pad is less than a second electrical resistance of the semiconductor device when a current flows in the semiconductor device via the second electrode pad, or the second electrical capacitance is greater than the first electrical capacitance, and the second electrical resistance is less than the first electrical resistance.

Configuration 4

The semiconductor device according to any one of Configurations 1 to 3, wherein a first electrical capacitance between the first electrode pad and the second electrode is greater than a second electrical capacitance between the second electrode pad and the second electrode, and an area of the first electrode pad is greater than an area of the second electrode pad, or the second electrical capacitance is greater than the first electrical capacitance, and the area of the second electrode pad is greater than the area of the first electrode pad.

Configuration 5

The semiconductor device according to Configuration 3 or 4, wherein the second electrical capacitance is greater than the first electrical capacitance.

Configuration 6

The semiconductor device according to any one of Configurations 1 to 5, wherein a plurality of the first control electrodes is provided, a plurality of the second control electrodes is provided, and a number of the second control electrodes is greater than a number of the first control electrodes.

Configuration 7

The semiconductor device according to any one of Configurations 1 to 6, wherein a potential of the second control electrode is switched from an on-state of being greater than a reference potential to an off-state of being less than the reference potential before a potential of the first control electrode is switched from an on-state of being greater than the reference potential to an off-state of being less than the reference potential.

Configuration 8

The semiconductor device according to any one of Configurations 1 to 7, wherein a semiconductor region of the second conductivity type is not provided on the third semiconductor region in contact with the second insulating film.

Configuration 9

The semiconductor device according to any one of Configurations 1 to 8, wherein the first electrode pad and the second electrode pad are positioned on a diagonal of the semiconductor device in a plane perpendicular to the first direction, and a center of the semiconductor device is positioned between the first electrode pad and the second electrode pad in the plane.

Configuration 10

The semiconductor device according to any one of Configurations 1 to 9, wherein the first electrode pad and the second electrode pad are located in a same plane.

According to embodiments, a semiconductor device can be provided in which the electrode pads are easily distinguished.

In the embodiments above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The relative levels of the impurity concentrations between the semiconductor regions can be considered to correspond to the relative levels of the carrier concentrations between the semiconductor regions. Also, the impurity concentration in each semiconductor region can be measured by, for example, SIMS (secondary ion mass spectrometry).

In this specification, being "electrically connected" includes not only the case of being connected in direct contact, but also the case of being connected via another conductive member, etc.

The scope of one component being "located on" another component may include not only the case where the two components contact each other (or are continuous), but also the case where another component is located between the two components. For example, the scope of one component being "located on" another component may include the case where one component is positioned above another component regardless of whether or not the two components contact each other.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type;

a third semiconductor region located on the second semiconductor region, the third semiconductor region being of the first conductivity type;

a fourth semiconductor region located on a portion of the third semiconductor region, the fourth semiconductor region being of the second conductivity type;

a first control electrode facing the second, third, and fourth semiconductor regions via a first insulating film;

a second control electrode separated from the first control electrode in a second direction perpendicular to a first direction, the first direction being from the first electrode toward the first semiconductor region, the second control electrode being electrically isolated from the first control electrode, the second control electrode facing the second and third semiconductor regions via a second insulating film;

a second electrode positioned above the third and fourth semiconductor regions, the second electrode being electrically connected with the third and fourth semiconductor regions;

a first electrode pad electrically connected with the first control electrode; and a second electrode pad electrically connected with the second control electrode, the second electrode pad having a different planar shape from the first electrode pad.

2. The semiconductor device according to claim 1, wherein an area of the first electrode pad is different from an area of the second electrode pad.

3. The semiconductor device according to claim 1, wherein a first electrical capacitance between the first electrode pad and the second electrode is greater than a second electrical capacitance between the second electrode pad and the second electrode, and a first electrical resistance of the semiconductor device when a current flows in the semiconductor device via the first electrode pad is less than a second electrical resistance of the semiconductor device when a current flows in the semiconductor device via the second electrode pad, or the second electrical capacitance is greater than the first electrical capacitance, and the second electrical resistance is less than the first electrical resistance.

4. The semiconductor device according to claim 1, wherein a first electrical capacitance between the first electrode pad and the second electrode is greater than a second electrical capacitance between the second electrode pad and the second electrode, and an area of the first electrode pad is greater than an area of the second electrode pad, or the second electrical capacitance is greater than the first electrical capacitance, and the area of the second electrode pad is greater than the area of the first electrode pad.

5. The semiconductor device according to claim 3, wherein the second electrical capacitance is greater than the first electrical capacitance.

6. The semiconductor device according to claim 1, wherein a plurality of the first control electrodes is provided, a plurality of the second control electrodes is provided, and a number of the second control electrodes is greater than a number of the first control electrodes.

7. The semiconductor device according to claim 1, wherein a potential of the second control electrode is switched from an on-state of being greater than a reference potential to an off-state of being less than the reference potential before a potential of the first control electrode is switched from an on-state of being greater than the reference potential to an off-state of being less than the reference potential.

8. The semiconductor device according to claim 1, wherein a semiconductor region of the second conductivity type is not provided on the third semiconductor region in contact with the second insulating film.

9. The semiconductor device according to claim 1, wherein the first electrode pad and the second electrode pad are positioned on a diagonal of the semiconductor device in a plane perpendicular to the first direction, and a center of the semiconductor device is positioned between the first electrode pad and the second electrode pad in the plane.

10. The semiconductor device according to claim 1, wherein the first electrode pad and the second electrode pad are located in a same plane.

* * * * *